(12) United States Patent  
Ikeda

(10) Patent No.: US 6,631,094 B2
(45) Date of Patent: Oct. 7, 2003

(54) SEMICONDUCTOR MEMORY DEVICE HAVING SRAM INTERFACE

(75) Inventor: Hitoshi Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/931,757

(22) Filed: Aug. 20, 2001

(65) Prior Publication Data

US 2002/0054533 A1 May 9, 2002

(30) Foreign Application Priority Data

Nov. 6, 2000 (JP) ........................................ 2000-338057

(51) Int. Cl.$^7$ ................................................ G11C 8/00
(52) U.S. Cl. ............... 365/230.08; 365/194; 365/233.5; 365/241
(58) Field of Search ............................. 365/230.08, 194, 365/221, 233.5, 241

(56) References Cited

U.S. PATENT DOCUMENTS

| 4,809,233 | A | * | 2/1989 | Takemae | ..................... 365/222 |
| 5,537,066 | A | * | 7/1996 | Kawashima | ................ 327/208 |
| 5,684,752 | A | * | 11/1997 | Mills et al. | ............ 365/230.03 |
| 6,122,203 | A | * | 9/2000 | Hunt et al. | ............ 365/189.05 |
| 6,324,109 | B1 | * | 11/2001 | Inoue | .......................... 365/203 |
| 6,324,113 | B1 | * | 11/2001 | Tomita | ........................ 365/222 |

* cited by examiner

Primary Examiner—VanThu Nguyen
(74) Attorney, Agent, or Firm—Arent Fox Kintner Plotkin & Kahn, PLLC

(57) ABSTRACT

A semiconductor memory device includes a latch circuit which latches an address signal supplied from an exterior of the device, a core circuit which includes memory cells, to which access is made at the address stored in the latch circuit, and a latch timing control circuit which records a fact that the address signal is changed during an operation of the core circuit, and makes the latch circuit latch the changed address signal after a completion of the operation of the core circuit.

10 Claims, 5 Drawing Sheets

FIG. 6
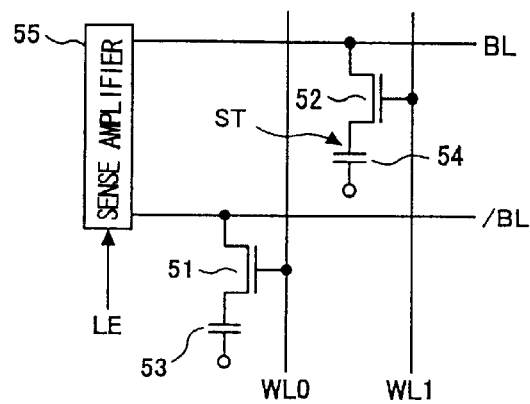
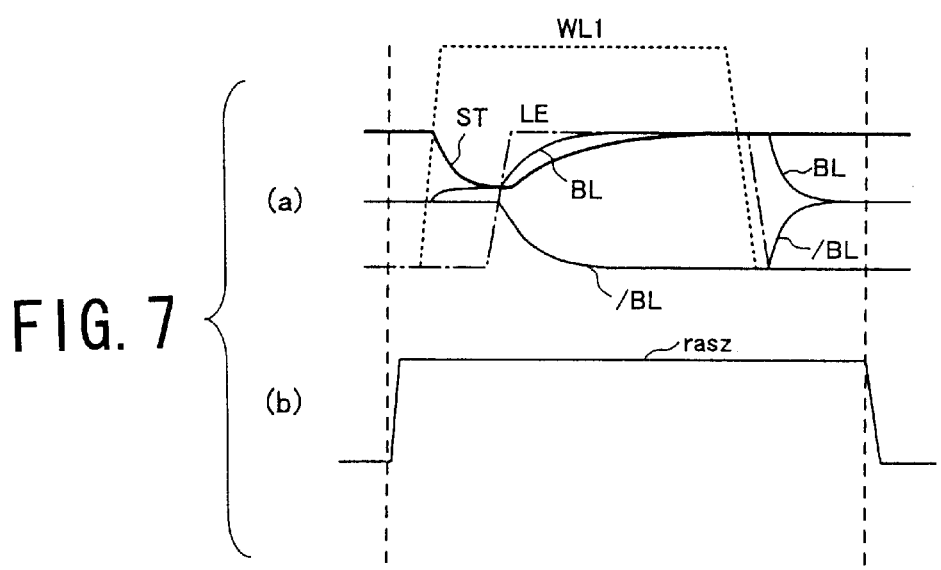
FIG. 7

SEMICONDUCTOR MEMORY DEVICE HAVING SRAM INTERFACE

BACKGROUND OF THE INVENTION

1. Field of the Invention

The present invention generally relates to semiconductor memory devices, and particularly relates to a DRAM (dynamic random access memory) that has an SRAM interface.

2. Description of the Related Art

In mobile phone communications, the amount of data handling has been on the increase because of the communication link with the Internet or the like, and the mobile phones are now required to be equipped with a large memory volume. At present, mobile phones employ SRAMs (static random access memories), which can operate with small electric current consumption. SRAMs have drawbacks in that circuit density is small, and in that an increase in memory volume results in a significant cost increase.

DRAMs, on the other hand, are suitable for constructing a large volume memory at low costs. Because of this, it is quite conceivable to use DRAMs on mobile phones in place of SRAMs. Since there is a great amount of technology accumulations in the use of SRAMs in mobile phones, however, it is preferable to provide DRAMs that act like SRAMs on the surface, rather than to redesign mobile phones to be suitable for DRAMs. Accordingly, there is an expectation that DRAMs become available that have an interface identical to that of SRAMs.

Control systems differ between DRAMs and SRAMs in many aspects. One of such differences is an address timing requirement at the time of a data read operation. In SRAMs, there are two methods of controlling read operations, one being to start a read operation by dropping a chip enable signal /CE, and the other being to start a read operation by changing an address when the chip enable signal is already at the dropped level (i.e., /CE=L).

Since there is no timing requirement in SRAMs with respect to an address at the time of a read operation, both methods described above will result in data of the last entered address being output. This will be further described below. In SRAMs, memory cells are basically flip-flops, so that nondestructive data reading is possible, i.e., the data contents will not be lost upon access to the memory cells. Accordingly, no matter how the input address changes, the output data supplied from the memory cells to an exterior of the device changes at every turn by following changes of the input address. No matter whether the data is read by dropping the chip enable signal or the address is changed when the chip enable signal is already at the dropped level, data that is being output at a given moment is the data that corresponds to the last entered address, regardless of history of address changes. If the address further changes at this moment, the output data will follow the change. In this manner, there is no timing requirement regarding timing at which an address is supplied at the time of a read operation, and an output that corresponds to a supplied address is obtained immediately in response to the supplied address given at any timing.

In DRAM memory cells, on the other hand, only destructive data reading is possible, i.e., the data contents will be lost upon access to the memory cells. In DRAMs, therefore, a restore process is necessary that restores the data of sense amplifiers in the memory cells. During the restore process, an address change to access other memory cells is prohibited. Because of this, the address supplied at the start of a read operation is stored in an internal latch, and the latched address is maintained as a fixed address during the period of data reading. It is thus impossible in DRAMs, as opposed to in the case of SRAMs, to obtain an output data at a desired timing by changing the address at the desired timing.

Because of the reasons described above, DRAMs that provide an interface compatible with that of asynchronous SRAMs generally need some timing requirements defined for their address input. For example, a drop of the chip enable signal /CE or a first change in the address signals may be detected to store an address in memory. In this case, a setup time and hold time of an access address must be defined with respect to the drop of the signal /CE or the first change of the address signals. In such a configuration, however, a wrong address will be accessed if the setup time of the address is not sufficient or if there is a long time delay from the first change of the address signals to the last change of the address signals.

Accordingly, there is a need for a DRAM that has an SRAM-type interface with no address timing requirements.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor memory device, including a latch circuit which latches an address signal supplied from an exterior of the device, a core circuit which includes memory cells, to which access is made at the address stored in the latch circuit, and a latch timing control circuit which records a fact that the address signal is changed during an operation of the core circuit, and makes the latch circuit latch the changed address signal after a completion of the operation of the core circuit.

The latch timing control circuit described above records a fact that the address signal is changed during an operation of the core circuit, and controls an access operation to be performed on the core circuit after the completion of the operation of the core circuit.

Further, the latch timing control circuit described above makes the latch circuit latch the address signal immediately upon detecting a change of the address signal if the change of the address signal is detected while the core circuit is not operating.

Moreover, the latch timing control circuit makes the latch circuit latch the address signal immediately upon detecting a drop of a chip enable signal if the drop of the chip enable signal is detected while the core circuit is not operating.

In the present invention as described above, a read operation is performed on the DRAM core circuit at an address presented at the time of a drop of the chip enable signal, but the output data will change by following a subsequent change in the address signal. Further, if a read operation is performed first by responding to a first signal change of an address transition, a read operation is performed again with respect to a correct address as presented after the address transition when the last signal change of the address transition is completed.

This is achieved by rewriting an internal address stored in the latch circuit after the completion of a core operation rather than rewriting the internal address immediately upon detection of an address change during the core operation. In the use of a DRAM core circuit, therefore, there is no need to define timing requirements for the address signal transition time, making it possible to provide an interface that is compatible with that of SRAMs. It should be noted that when the address is changed multiple times during the core circuit operation, the output data will end up being the data responding to the last entered address.

This makes it possible to provide a semiconductor memory device that is usable in place of conventional SRAMs while the semiconductor memory device has a large memory volume and is provided at a low cost.

BRIEF DESCRIPTION OF THE DRAWINGS

FIG. 6 is a circuit diagram showing a main portion of a core circuit of a memory cell array; and FIG. 7 is a diagram of signal waveforms for showing the relationship between a control signal and the internal signals of the core circuit.

DESCRIPTION OF THE PREFERRED EMBODIMENTS

In the following, embodiments of the present invention will be described with reference to the accompanying drawings.

Figure 1:
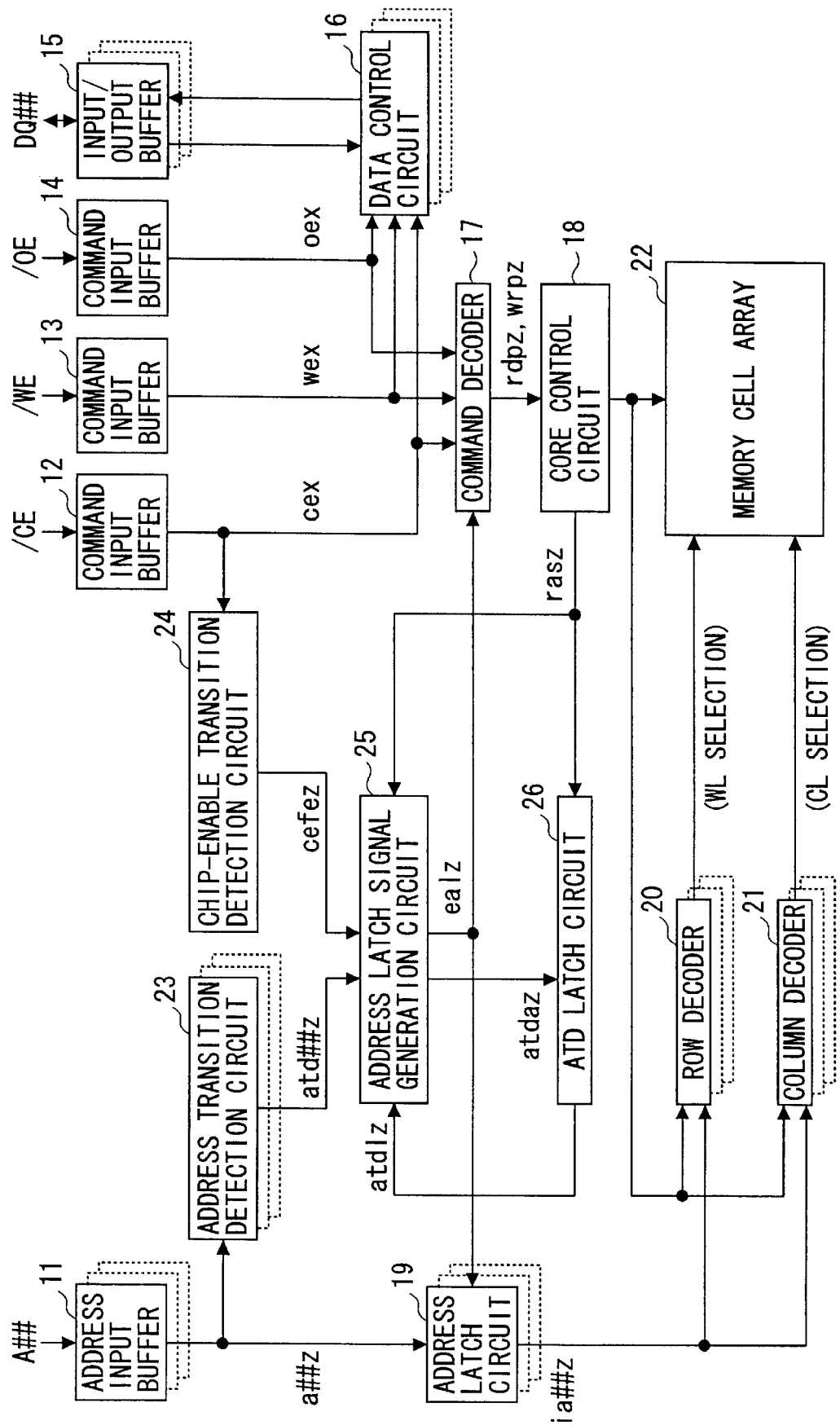
FIG. 1 is a block diagram of a DRAM having an SRAM-type interface according to the present invention.

FIG. 1 is a block diagram of a DRAM having an SRAM-type interface according to the present invention.

A DRAM 10 of FIG. 1 includes a plurality of address input buffers 11, command input buffers 12 through 14, a plurality of input/output buffers 15, a data control circuit 16, a command decoder 17, a core control circuit 18, an address latch circuit 19, a row decoder 20, a column decoder 21, a memory cell array (core circuit) 22, an address transition detection circuit 23, a chip-enable transition detection circuit 24, an address latch signal generating circuit 25, and an ATD latch circuit 26.

The command input buffers 12 through 14 receives controls signals, i.e., a chip enable signal /CE, a write enable signal /WE, and an output enable signal /OE, respectively, from an exterior of the device, and supplies respective control signals cex, wex, and oex to both the data control circuit 16 and the command decoder 17. The control signal cex is also supplied to the chip-enable transition detection circuit 24.

The command decoder 17 decodes a command represented by the control signals at the timing indicated by a timing signal ealz supplied from the address latch signal generating circuit 25. The decoding results including a read command signal rdpz and a write command signal wdpz are supplied to the core control circuit 18.

The core control circuit 18 controls the row decoder 20, the column decoder 21, and the memory cell array 22 in accordance with the control signals, thereby performing a data read operation and a data write operation.

The address input buffers 11 receive respective address signals A## (A01, A02, A03, . . . ) from the exterior of the device, and supplies the address signals to the address transition detection circuit 23 and to the address latch circuit 19. The address latch circuit 19 latches an address signal at the timing indicated by the timing signal ealz supplied from the address latch signal generating circuit 25, and supplies the latched address signal to the row decoder 20 and the column decoder 21.

The row decoder 20 decodes a row address, and activates a word line indicated by the decoded row address in the memory cell array 22. In the memory cell array 22, data of memory cells connected to the activated word line are supplied to sense amplifiers via bit lines. The memory cell array 22 is comprised of a core circuit of a DRAM type that stores electric charge in memory cell capacitors. The column decoder 21 decodes a column address, and activates a column selection line indicated by the decoded column address in the memory cell array 22. The data of sense amplifiers connected to the activated column selection line are supplied from the memory cell array 22 to the data control circuit 16.

The data control circuit 16 operates based on the control signals supplied from the exterior of the device via the command input buffers 12 through 14, and supplies the data read from the memory cell array 22 to the input/output buffers 15. The input/output buffers 15 supplies the read data to the exterior of the DRAM 10, and receives data to be written from the exterior of the device. The data to be written is stored in the memory cells of a selected word in the memory cell array 22 after it is transferred through the data control circuit 16, the sense amplifiers, bit lines, etc.

In order to provide an asynchronous SRAM interface, the DRAM 10 of FIG. 1 includes the address transition detection circuit 23, the chip-enable transition detection circuit 24, the address latch signal generating circuit 25, and the ATD latch circuit 26. The address latch signal generating circuit 25 and the ATD latch circuit 26 together make up a latch timing control circuit that controls latch timing of the address latch circuit 19.

The address transition detection circuit 23 is provided as many as there are address bits, which are supplied from the address input buffers 11. Each address transition detection circuit 23 receives a corresponding address signal from a corresponding address input buffer 11, and outputs a pulse signal in response to a rising edge or a falling edge of the address signal. This pulse signal atd##z (atd00z, atd01z, atd02z, . . . ) is supplied to the address latch signal generating circuit 25.

The chip-enable transition detection circuit 24 receives the control circuit cex from the command input buffer 12, and outputs a pulse signal in response to a falling edge of the control signal cex. This pulse signal cefez is supplied to the address latch signal generating circuit 25.

The address latch signal generating circuit 25 obtains a logic OR of all the pulse signals atd##z and the pulse signal cefez, thereby generating the timing signal ealz. The timing signal ealz is supplied to the address latch circuit 19 and the command decoder 17 to define an address latch timing and a command decode timing. In response to the timing signal ealz, the address latch circuit 19 latches the address signals a##z supplied from the address input buffers 11. The command decoder 17 asserts a read command signal rdpz to start a read operation if a read operation is indicated (/CE=L, /OE=L, /WE=H) at the time when the timing signal ealz is supplied.

If the internal address is changed while the memory core circuit of the memory cell array 22 is operating, data will be destroyed. To prevent this, the address latch signal generating circuit 25 outputs the timing signal ealz once, and does not output a next one of the timing signal ealz until the operation of the core circuit is completed in the memory cell array 22. Namely, even if the addresses A## entered from the exterior of the device are changed during the operation of the core circuit, and the address transition detection circuit 23 supplies the pulse signals atd##z, the address latch signal generating circuit 25 does not output the timing signal ealz immediately at this time.

The fact that there was an address change during the operation of the core circuit is recorded in the ATD latch circuit 26. When the operation of the core circuit is completed in the memory cell array 22, the ATD latch circuit 26 informs the address latch signal generating circuit 25 that there was an address change during the core operation. Having received this notice, the address latch signal generating circuit 25 outputs the timing signal ealz responding to this address change. In response to this, the address latch circuit 19 latches current address signals, and the command decoder 17 outputs the read command signal rdpz, thereby starting a read operation with respect to the address as presented after the address change.

The control relating to the core operation as described above is performed by using a control signal rasz output from the core control circuit 18. The control signal rasz stays HIGH during the operation of the core circuit in the memory cell array 22, and is supplied from the core control circuit 18 to the ATD latch circuit 26. The ATD latch circuit 26 receives an address change detection signal atdaz that is generated by the address latch signal generating circuit 25 as the address latch signal generating circuit 25 detects an address change. The ATD latch circuit 26 sets an internal flip-flop circuit provided therein in response to this address change detection signal, thereby recording the fact that there was an address change. When the control signal rasz becomes LOW after the completion of the core circuit operation, the ATD latch circuit 26 resets the internal flip-flop circuit, and supplies an address change reporting signal atdlz to address latch signal generating circuit 25. In response to the address change reporting signal atdlz, the address latch signal generating circuit 25 generates the timing signal ealz.

Figure 2:
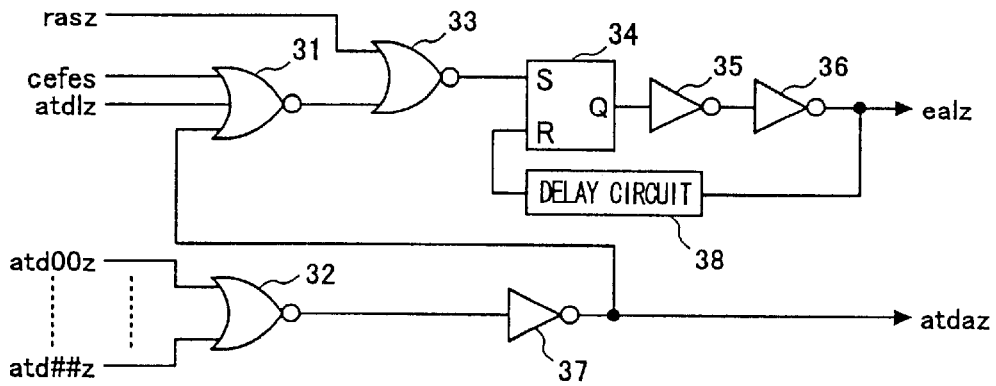
FIG. 2 is a circuit diagram showing an embodiment of an address latch signal generating circuit.

FIG. 2 is a circuit diagram showing an embodiment of the address latch signal generating circuit 25.

The address latch signal generating circuit 25 of FIG. 2 includes NOR circuits 31 through 33, a flip-flop 34, inverters 35 through 37, and a delay circuit 38.

The NOR circuit 32 and the inverter 37 receive the pulse signals atd##z indicative of an address transition when they are supplied from the address transition detection circuit 23, and obtains a logic OR of these signals, thereby generating the address change detection signal atdaz. The address change detection signal atdaz is supplied to the ATD latch circuit 26.

In the following, a description will be given first with regard to a case in which the core circuit is not operating, and the control signal rasz is LOW.

The NOR circuit 31 receives the pulse signal cefez responding to a falling edge of the chip enable signal from the chip-enable transition detection circuit 24, and further receives the address change detection signal atdaz. Since the control signal rasz is LOW, the NOR circuit 33 functions as an inverter, so that a logic OR of the pulse signal cefez and the address change detection signal atdaz is supplied to a set input of the flip-flop 34. Accordingly, the flip-flop 34 is set when there is an address transition or when the chip enable is asserted, resulting in the timing signal ealz being HIGH. Upon the passage of a predetermined delay time, the output of the delay circuit 38 becomes HIGH, thereby resetting the flip-flop 34. Accordingly, the timing signal ealz is a pulse signal that becomes HIGH only during the predetermined time period.

When the control signal rasz is HIGH due to the operation of the core circuit, the output of the NOR circuit 33 is fixed to LOW, so that the flip-flop 34 is not set. In this case, therefore, no timing signal ealz is output. This prevents data destruction in the memory cell array 22 that would be caused by rewriting of address data in the address latch circuit 19 when there was an address change during the operation of the core circuit.

Figure 3:
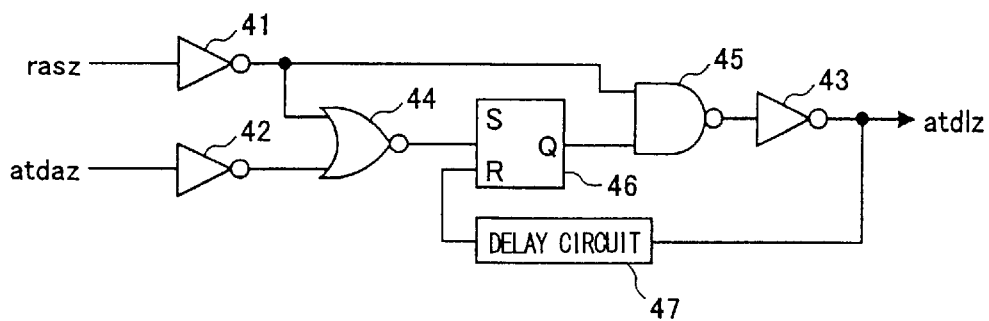
FIG. 3 is a circuit diagram showing an embodiment of an ATD latch circuit.

FIG. 3 is a circuit diagram showing an embodiment of the ATD latch circuit 26.

The ATD latch circuit 26 of FIG. 3 includes inverters 41 through 43, a NOR circuit 44, a NAND circuit 45, a flip-flop 46, and a delay circuit 47.

The inverters 41 and 42 and the NOR circuit 44 together form an AND circuit. A set input of the flip-flop 46 receives a logic AND of the control signal rasz and the address change detection signal atdaz. Accordingly, the flip-flop 46 is set only when an address transition takes place during the operation of the core circuit. Since the output of the inverter 41 is LOW when an address transition takes place during the operation of the core circuit, the output of the NAND circuit 45 is fixed to HIGH. No address change reporting signal atdlz is thus output.

In this manner, the ATD latch circuit 26 records the occurrence of an address change by setting the internal flip-flop circuit 46. When the control signal rasz becomes LOW after the end of the core circuit operation, the output of the NAND circuit 45 changes to LOW, so that the address change reporting signal atdlz turns HIGH. When the address change reporting signal atdlz turns HIGH, the output of the delay circuit 47 changes to HIGH upon the passage of a predetermined delay time, thereby resetting the flip-flop 46. As a result, the address change reporting signal atdlz is output as a pulse signal that becomes HIGH only during the predetermined time period.

As was previously described, the address change reporting signal atdlz is supplied to the address latch signal generating circuit 25, which responds by outputting the timing signal ealz.

Figure 4:
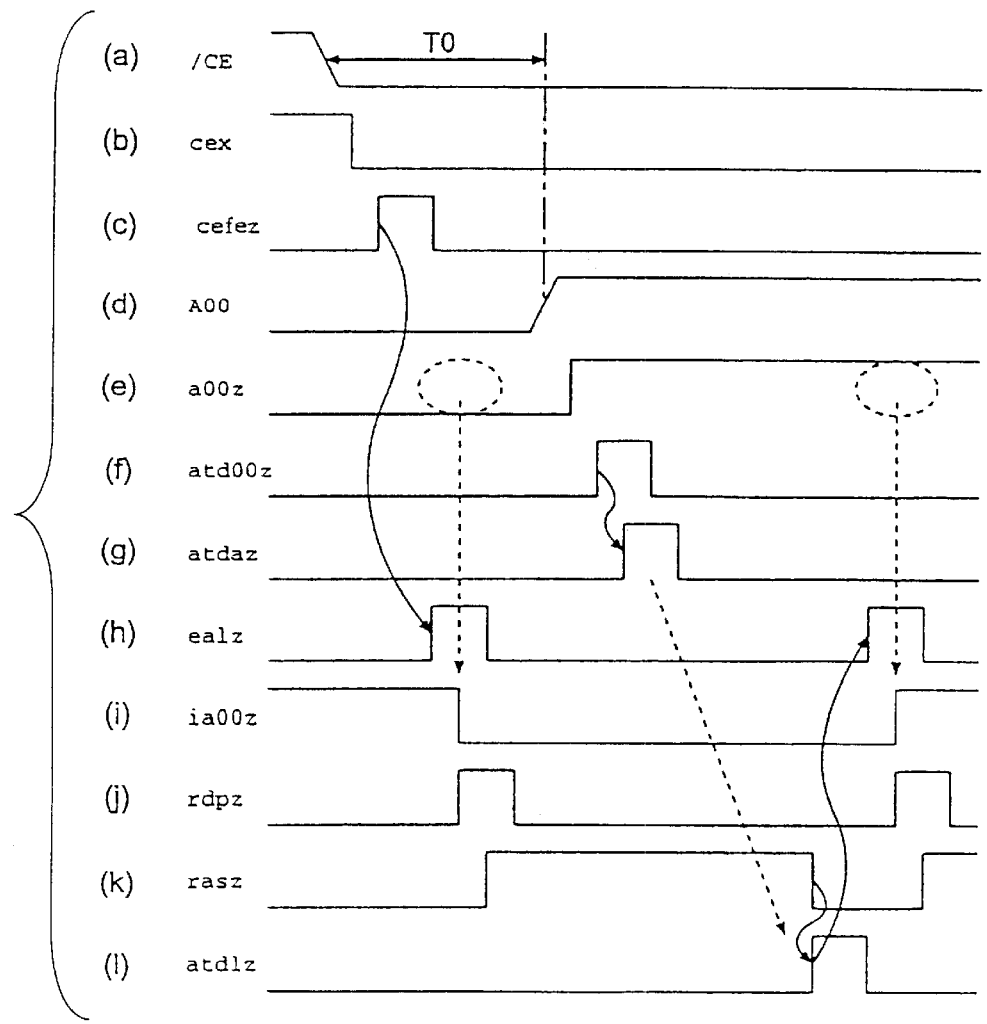
FIG. 4 a diagram showing signal waveforms observed when an address changes after the start of a read operation responding to a drop of a chip enable signal.

FIG. 4 a diagram showing signal waveforms observed when an address changes after the start of a read operation responding to a drop of the chip enable signal /CE.

In FIG. 4, a letter designation (a) shows the chip enable signal /CE, and a letter designation (b) identifies the signal cex output from the command input buffer 12 that corresponds to the chip enable signal /CE. A letter designation (c) indicates the pulse signal cefez output from the chip-enable transition detection circuit 24, and a letter designation (d) shows an address signal A00 as an example of address signals. Further, a letter designation (e) identifies an address signal a00z output from the address input buffer 11 corresponding to the address signal A00. A letter designation (f) indicates the pulse signal atd00z output from the address transition detection circuit 23 corresponding to the address signal A00. A letter designation (g) shows the address change detection signal atdaz generated by the address latch signal generating circuit 25, and a letter designation (h) indicates the timing signal ealz generated by the address latch signal generating circuit 25. Further, a letter designation (i) indicates an internal address signal ia00z output from the address latch circuit 19 corresponding to the address signal a00z, and a letter designation (j) is a read command signal rdpz generated by the command decoder 17, with a letter designation (k) identifying the control signal rasz indicative of the period of a core circuit operation where the control signal rasz is generated by the core control circuit 18. A letter designation (l) shows an address change reporting signal atdlz generated by the ATD latch circuit 26.

As shown in FIG. 4, when the chip enable signal /CE drops, the pulse signal cefez is generated to indicate a chip enable change. In response to the pulse signal cefez, the address latch signal generating circuit 25 generates the timing signal ealz.

In the example of FIG. 4, the address signal A00 provided from the exterior of the device is entered a time T0 after the drop of the chip enable signal /CE (i.e., shows a transition a time T0 after the drop). As shown in FIG. 4, the timing at which the address signal A00 changes is after the timing at which the address latch signal generating circuit 25 outputs the timing signal ealz. In response to the timing signal ealz, therefore, the address signal a00z that is LOW before the change is latched, resulting in the internal address signal ia00z changing to LOW. Further, a read operation starts when the read command signal rdpz is generated in response to the timing signal ealz. This read operation is carried out with respect to the address as presented before the address change. Since the core circuit starts operating, the control signal rasz becomes HIGH.

During a period when the control signal rasz is HIGH due to the core circuit operation, the address signal A00 exhibits a transition. The address change detection signal atdaz is generated in response to the address change. Despite this, the timing signal ealz is not generated because the control signal rasz is HIGH due to the core circuit operation.

When the control signal rasz becomes LOW after the completion of the core circuit operation, the ATD latch circuit 26 that has a record therein indicative of the address change detection signal atdaz generates the address change reporting signal atdlz. In response to the address change reporting signal atdlz, the address latch signal generating circuit 25 generates the timing signal ealz.

In response to this second timing signal ealz, the address latch circuit 19 latches the address signal a00z as presented after the address change, so that the internal address ia00z reflects the post-transition address. Further, the read command signal rdpz is generated in response to the timing signal ealz, thereby starting a read operation. This read operation is performed with respect to the address as presented after the address transition.

In the present invention as described above, a read operation is performed with respect to an address supplied at the time of a drop of the chip enable signal, but the output data changes by following subsequent changes of address signals. This is achieved by rewriting an internal address after the completion of a core operation rather than rewriting an internal address immediately upon detection of an address change during the core operation. In the use of a DRAM core circuit, therefore, there is no need to define the timing requirements of address signals with respect to the chip enable signal, making it possible to provide an interface that is compatible with that of SRAMs. When the address is changed multiple times during the core operation, data that corresponds to the last entered address will be output.

Figure 5:
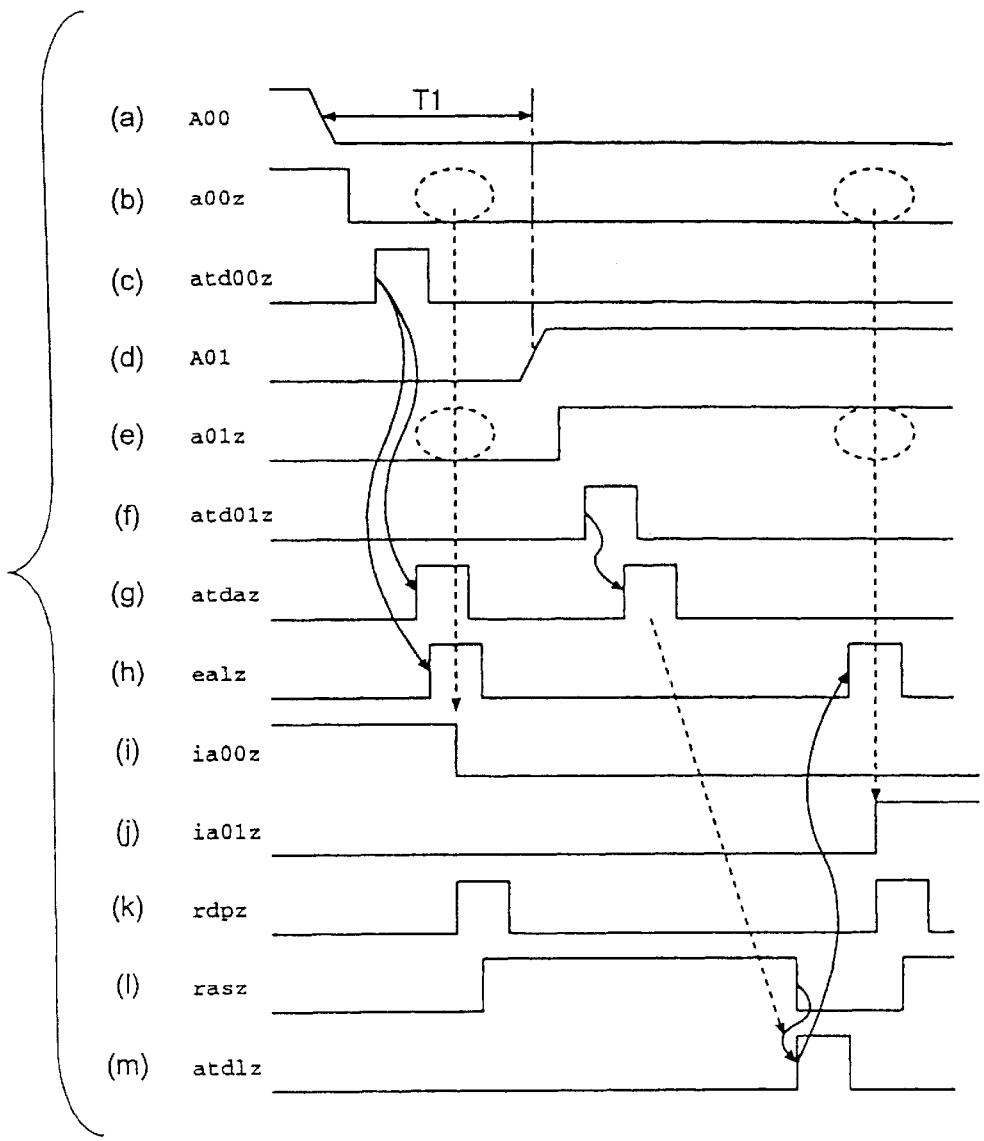
FIG. 5 is a drawing showing signal waveforms in the case of a read operation in which an address transition takes a long time.

FIG. 5 is a drawing showing signal waveforms in the case of a read operation in which an address transition takes a long time.

In FIG. 5, a letter designation (a) shows an address signal A00, and a letter designation (b) identifies an address signal a00z output from the address input buffer 11 corresponding to the address signal A00. A letter designation (c) indicates the pulse signal atd00z output from the address transition detection circuit 23 corresponding to the address signal A00. Further, a letter designation (d) shows an address signal A01, and a letter designation (e) identifies an address signal a01z output from the address input buffer 11 corresponding to the address signal A01. A letter designation (f) indicates the pulse signal atd01z output from the address transition detection circuit 23 corresponding to the address signal A01. A letter designation (g) shows the address change detection signal atdaz generated by the address latch signal generating circuit 25, and a letter designation (h) indicates the timing signal ealz generated by the address latch signal generating circuit 25. Further, a letter designation (i) indicates an internal address signal ia00z output from the address latch circuit 19 corresponding to the address signal a00z, and a letter designation (j) indicates an internal address signal ia01z output from the address latch circuit 19 corresponding to the address signal a01z. A letter designation (k) is a read command signal rdpz generated by the command decoder 17, and a letter designation (l) identifying the control signal rasz indicative of the period of a core circuit operation where the control signal rasz is generated by the core control circuit 18. A letter designation (m) shows an address change reporting signal atdlz generated by the ATD latch circuit 26.

As shown in FIG. 5, the external address signal A01 changes a time T1 after the external address signal A00 changes. Here, the external address signal A00 changes ahead of any other address signals, and the external address signal A01 changes later than any other address signals. Namely, the address transition completes by spending the time T1.

In response to the change of the external address signal A00, the pulse signal atd00z is generated as an output of the address transition detection circuit 23. Responding to this pulse signal, the address latch signal generating circuit 25 generates the address change detection signal atdaz and the timing signal ealz.

In response to the timing signal ealz, the address signals a00z and a01z that are LOW are latched, resulting in the internal address signals ia00z and ia01z changing to LOW. Further, a read operation starts when the read command signal rdpz is generated in response to the timing signal ealz. This read operation is carried out with respect to an address as presented immediately after the change of the external address signal A00, i.e., is carried out with respect to a wrong address as presented before the completion of a transition. Since the core circuit starts operating, the control signal rasz becomes HIGH.

During a period when the control signal rasz is HIGH due to the core circuit operation, the external address signal A01 exhibits a transition. The address change detection signal atdaz is generated in response to the address change. Despite this, the timing signal ealz is not generated because the control signal rasz is HIGH due to the core circuit operation.

When the control signal rasz becomes LOW after the completion of the core circuit operation, the ATD latch circuit 26 that has a record therein indicative of the address change detection signal atdaz generates the address change reporting signal atdlz. In response to the address change reporting signal atdlz, the address latch signal generating circuit 25 generates the timing signal ealz.

In response to this second timing signal ealz, the address latch circuit 19 latches the address signals a00z and a01z as presented after the address change, so that the internal addresses ia00z and ia01z reflect the post-transition address. Further, the read command signal rdpz is generated in response to the timing signal ealz, thereby starting a read operation. This read operation is performed with respect to the address as presented after the address transition.

In the present invention as described above, a read operation is performed first by responding to a first signal change of an address transition, but is performed again with respect to a correct address as presented after the address transition when the last signal change of the address transition is completed. This is achieved by rewriting an internal address after the completion of a core operation rather than rewriting an internal address immediately upon detection of an address change during the core operation. In the use of a DRAM core circuit, therefore, there is no need to define timing requirements for the address signal transition time, making it possible to provide an interface that is compatible with that of SRAMs.

FIG. 6 is a circuit diagram showing a main portion of a core circuit of the memory cell array 22.

As shown in FIG. 6, memory cell capacitors 53 and 54 are connected to bit lines BL and /BL via transistors 51 and 52, respectively. Word lines WL0 and WL1 are connected to the gates of the transistors 51 and 52, respectively. When these word lines are selectively activated, data of the memory cells are read out to the bit lines BL and /BL.

The data on the bit lines BL and /BL are amplified by a sense amplifier 55. Operations of the sense amplifier 55 are controlled by a sense amplifier activation signal LE, which is changed to HIGH in order to drive the sense amplifier.

FIG. 7 is a diagram of signal waveforms for showing the relationship between the control signal rasz and the internal signals of the core circuit.

As shown by a letter designation (a) in FIG. 7, the word line WL1 becomes HIGH. In response, the transistor 52 of FIG. 6 becomes conductive. As the memory cell is electrically connected to the bit line, the electric charge of the memory cell is supplied to the bit line, so that a potential ST at a node between the memory cell 54 and the transistor 52 shown in FIG. 6 drops as shown by the letter designation (a) in FIG. 7. In response, the potential of the bit line BL rises. At this timing, the sense amplifier activation signal LE becomes HIGH, the sense amplifier 55 starts operating. By the sense amplifier 55, the potential difference between the bit line BL and the bit line /BL is amplified. Data is read out when the potential difference between the bit lines BL and /BL is sufficiently large. Concurrently with this, the potential ST at the above-mentioned node returns to its original level, thereby completing a data restoration process. After the word line WL1 and the sense amplifier activation signal LE return to LOW, a precharge operation and an equalize operation are carried out to charge the bit lines to the same intermediate potential. As a result, the bit lines BL and /BL are set at the same potential.

A letter designation (b) of FIG. 7 shows a signal waveform of the control signal rasz in relation to the signal waveforms of FIG. 7, (a). As previously described, the control signal rasz indicates the period during which a core circuit operates. As shown by the letter designation (b) of FIG. 7, the control signal rasz becomes HIGH before the activation of the word line by leaving a time margin that would be necessary for the selection of the word line, i.e., for the decoding operation and the like, and becomes LOW after the precharge operation of the bit lines BL and /BL is completed. Namely, the core circuit operation starts at the time when the control signal rasz becomes HIGH, and, then, the word line selecting operation, i.e., the decoding and activating of the word line, is performed to supply data of the memory cells to the bit lines, followed by activating the sense amplifiers, reading the data, and restoring data, then precharging the bit lines. When the bit lines are precharged to the same potential, and, thus, the precharge operation is completed, the control signal rasz becomes LOW as the core circuit operation is completed.

If notifying the address latch signal generating circuit 25 and the ATD latch circuit 26 of a core circuit operation period is the only purpose that needs to be taken into consideration, it is possible to advance the timing at which the control signal rasz returns to LOW. This is done by taking into account a time delay that passes from the responding operations by the address latch signal generating circuit 25 and the ATD latch circuit 26 to the latching of an address by the address latch circuit 19. Namely, even if the control signal rasz returns to LOW while the bit lines are not yet fully precharged, the operation of precharging the bit lines will be completed by the time the address latch circuit 19 actually latches the address. This is because there is a slight time delay from the responding operations by the address latch signal generating circuit 25 and the ATD latch circuit 26 to the latching of an address by the address latch circuit 19. In this manner, although the timing of the control signal rasz corresponds to the period of a core circuit operation in principle, actual setting of the timing is a matter of design choice, and the length of the HIGH period can be adjusted accordingly.

Further, the present invention is not limited to these embodiments, but various variations and modifications may be made without departing from the scope of the present invention.

The present application is based on Japanese priority application No. 2000-338057 filed on Nov. 6, 2000, with the Japanese Patent Office, the entire contents of which are hereby incorporated by reference.

What is claimed is:

1. A semiconductor memory device comprising:
   a latch circuit which latches an address signal supplied from an exterior of said semiconductor memory device;
   memory cells; and
   a latch timing control circuit which detects a transition into a new address signal, and outputs a latch signal to said latch circuit to latch the new address signal, wherein said latch timing control circuit does not output said latch signal until a completion of a precharge operation subsequent to a read operation of said memory cells according to the address signal and then outputs the latch signal after the completion of the precharge operation if said transition is detected prior to the completion of the precharge operation.

2. The semiconductor memory device as claimed in claim 1, wherein said latch timing control circuit controls an access operation to be performed on said memory cells after the completion of the precharge operation subsequent to the read operation of said memory cells.

3. The semiconductor memory device as claimed in claim 1, wherein said latch timing control circuit includes:

an address latch signal generating circuit which supplies a timing signal to said latch circuit as a latch instruction to latch the new address signal; and an address change latch circuit which records the fact that the new address signal is received during the precharge operation subsequent to the read operation of said memory cells, and supplies an address change reporting signal to said address latch signal generating circuit as a timing instruction to generate the timing signal after the completion of the precharge operation subsequent to the read operation of said memory cells.

4. A semiconductor memory device comprising:

a latch circuit which latches an address signal supplied from an exterior of said semiconductor memory device;

a core circuit which includes memory cells, to which access is made at the address stored in said latch circuit; and a latch timing control circuit which records a fact that a new address signal is received during an operation of said core circuit, and makes said latch circuit latch the new address signal after a completion of the operation of said core circuit, wherein said latch timing control circuit makes said latch circuit latch the new address signal immediately upon detecting an arrival of the new address signal if the arrival of the new address signal is detected while said core circuit is not operating.

5. A semiconductor memory device comprising:

a latch circuit which latches an address signal supplied from an exterior of said semiconductor memory device;

a core circuit which includes memory cells, to which access is made at the address stored in said latch circuit; and a latch timing control circuit which records a fact that a new address signal is received during an operation of said core circuit, and makes said latch circuit latch the new address signal after a completion of the operation of said core circuit, wherein said latch timing control circuit makes said latch circuit latch the new address signal immediately upon detecting a drop of a chip enable signal if the drop of the chip enable signal is detected while said core circuit is not operating.

6. A semiconductor memory device comprising:

a latch circuit which latches an address signal supplied from an exterior of said semiconductor memory device;

a core circuit which includes memory cells, to which access is made at the address stored in said latch circuit;

a latch timing control circuit which records a fact that a new address signal is received during an operation of said core circuit, and makes said latch circuit latch the new address signal after a completion of the operation of said core circuit; and a core control circuit which controls said core circuit, and generates a control signal indicative of a period during which said core circuit is operating, wherein said latch timing control circuit checks by referring to the control signal whether said core circuit is operating.

7. The semiconductor memory device as claimed in claim 6, wherein the control signal indicates from a start of an operation selecting a word line in said core circuit to an end of an operation precharging bit lines as said period.

8. A semiconductor memory device comprising:

a latch circuit which latches an address signal supplied from an exterior of said semiconductor memory device;

a core circuit which includes memory cells, to which access is made at the address stored in said latch circuit; and a latch timing control circuit which records a fact that a new address signal is received during an operation of said core circuit, and makes said latch circuit latch the new address signal after a completion of the operation of said core circuit; wherein said latch timing control circuit includes:

an address latch signal generating circuit which supplies a timing signal to said latch circuit as a latch instruction to latch the new address signal; and an address change latch circuit which records the fact that the new address signal is received during the operation of said core circuit, and supplies an address change reporting signal to said address latch signal generating circuit as a timing instruction to generate the timing signal after the completion of the operation of said core circuit, and wherein said address latch signal generating circuit generates the timing signal immediately upon detecting an arrival of the new address signal or a drop of a chip enable signal if the arrival of the new address signal or the drop of the chip enable signal is detected while said core circuit is not operating.

9. A semiconductor memory device comprising: memory cells; and a timing control circuit which detects a transition from an address signal to a new address signal supplied from an exterior of said semiconductor memory device, and initiates an operation based on the new address signal, wherein said timing control circuit does not initiate said operation until a completion of a precharge operation subsequent to a read operation of said memory cells according to the address signal and then initiates said operation after the completion of the precharge operation if said transition is detected prior to the completion of the precharge operation.

10. A semiconductor memory device comprising:

a core circuit which includes memory cells; and a timing control circuit which records a fact that a new address signal is supplied from an exterior of said semiconductor memory device during an operation of said core circuit, and causes an access operation to be performed on said core circuit based on the new address signal after a completion of the operation of said core circuit, wherein said timing control circuit causes the access operation to be performed on said core circuit based on a latest address signal immediately upon detecting an arrival of the new address signal or a drop of a chip enable signal if the change of the new address signal or the drop of the chip enable signal is detected while said core circuit is not operating.

* * * * *